United States Patent
Woodward et al.

(10) Patent No.: US 12,259,847 B2
(45) Date of Patent: *Mar. 25, 2025

(54) SYSTEMS AND METHODS FOR INTELLIGENT DIGITAL ITEM DISCOVERY AND MACHINE LEARNING-INFORMED HANDLING OF DIGITAL ITEMS AND DIGITAL ITEM GOVERNANCE

(71) Applicant: DryvIQ, Inc., Ann Arbor, MI (US)

(72) Inventors: Steve Woodward, Canton, MI (US); Shaun Becker, Canton, MI (US); Stefan Larson, Dexter, MI (US)

(73) Assignee: DryvIQ, Inc., Ann Arbor, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 17/985,214

(22) Filed: Nov. 11, 2022

(65) Prior Publication Data
US 2023/0072498 A1  Mar. 9, 2023

Related U.S. Application Data

(63) Continuation of application No. 17/849,555, filed on Jun. 24, 2022, now Pat. No. 11,531,640.
(Continued)

(51) Int. Cl.
*G06F 16/00* (2019.01)
*G06F 3/06* (2006.01)
(Continued)

(52) U.S. Cl.
CPC .......... *G06F 16/119* (2019.01); *G06F 3/0604* (2013.01); *G06F 3/0647* (2013.01);
(Continued)

(58) Field of Classification Search
CPC ...... G06F 16/119; G06F 16/35; G06F 16/908; G06F 3/0604; G06F 3/0647; G06F 3/067; G06F 30/27
See application file for complete search history.

(56) References Cited

U.S. PATENT DOCUMENTS 9,852,377 B1 * 12/2017 Kumar ................ G06N 5/04
11,599,667 B1 * 3/2023 Tutuianu ............. G06F 16/29
(Continued)

*Primary Examiner* — Diedra McQuitery
(74) *Attorney, Agent, or Firm* — Padowithz Alce; Alce PLLC

(57) ABSTRACT

Systems and methods of computing classifications for and migrating digital content that includes accessing a digital content corpus within a source data storage system; in response to accessing the digital content corpus, for each distinct item of digital content of the plurality of distinct items of digital content: computing, via one or more digital content machine learning classification models, a content classification inference; identifying automated digital content handling tasks of a plurality of distinct digital content handling tasks based on the content classification inference; executing the automated content handling tasks identified for each distinct item of digital content, wherein executing the automated content handling tasks includes: designating a storage location within a target data storage system based on the in-migration content classification inference; and migrating a respective item of digital content from the source data storage system to the designated storage location within the target data storage system.

18 Claims, 4 Drawing Sheets

Related U.S. Application Data

(60) Provisional application No. 63/215,203, filed on Jun. 25, 2021.

(51) Int. Cl.
 *G06F 16/11* (2019.01)
 *G06F 16/35* (2019.01)
 *G06F 30/27* (2020.01)
 *G06F 16/908* (2019.01)

(52) U.S. Cl.
 CPC .............. *G06F 3/067* (2013.01); *G06F 16/35* (2019.01); *G06F 30/27* (2020.01); *G06F 16/908* (2019.01)

(56) References Cited

U.S. PATENT DOCUMENTS

| | | | |
|---|---|---|---|
| 2005/0182773 A1* | 8/2005 | Feinsmith | G06Q 30/02 |
| 2013/0262349 A1* | 10/2013 | Bouqata | G06N 20/10 |
| | | | 706/12 |
| 2018/0218284 A1* | 8/2018 | Jawahar | G06N 3/08 |
| 2018/0232528 A1* | 8/2018 | Williamson | G06N 5/025 |
| 2020/0104377 A1* | 4/2020 | Earnesty, Jr. | G06F 9/4843 |
| 2021/0216831 A1* | 7/2021 | Ben-Itzhak | G06F 18/2155 |
| 2021/0342785 A1* | 11/2021 | Mann | G06F 11/3409 |
| 2021/0349865 A1* | 11/2021 | Shah | G06Q 30/0283 |
| 2022/0092407 A1 | 3/2022 | Chen et al. | |
| 2022/0292529 A1 | 9/2022 | Kapich et al. | |
| 2022/0327378 A1* | 10/2022 | Rangan | G06N 3/047 |

\* cited by examiner

200

- Implementing File System Discovery 210
- Creating File System Map Abstraction Layer 215
- Establishing Migration Nexus 220
- Implementing Content Recognition 230
- Implementing Feature Discovery | Feature Extraction 240
- Implementing Content Classification | Sensitivity Evaluation 250
- Evaluating Content Sensitivity 255
- Implementing Classification-based Content Routing 260

FIGURE 2

SYSTEMS AND METHODS FOR INTELLIGENT DIGITAL ITEM DISCOVERY AND MACHINE LEARNING-INFORMED HANDLING OF DIGITAL ITEMS AND DIGITAL ITEM GOVERNANCE

CROSS-REFERENCE TO RELATED APPLICATIONS

This application is a continuation of U.S. patent application Ser. No. 17/849,555, filed 24 Jun. 2022, which claims the benefit of U.S. Provisional Application No. 63/215,203, filed on 25 Jun. 2021, which are incorporated herein their entireties by this reference.

TECHNICAL FIELD

This invention relates generally to the data handling and data governance fields, and more specifically to a new and useful systems and methods for machine learning-based classifications of data items for sensitivity-informed handling and governance in the data handling and data governance fields.

BACKGROUND

Evolving data security and data compliance risks are some of the factors that may be driving entities to take different approaches to handling their data including reorganizing their data from decentralized and often complex storage systems to centralized, cloud-based storage architectures. Additionally, misclassified digital items and unstructured digital items may further complicate attempts so successful govern and/or manage digital items throughout any type of storage system.

In traditional on-premises data storage and nonintegrated or disjointed storage architectures, identifying data files and content that may include potentially sensitive information and further managing permissions for controlling access to files and content having high security threat and compliance risks can be especially difficult.

Thus, there are needs in the data handling and data governance fields to create improved systems and methods for intelligently handling data and providing intuitive data governance and controls that curtail the several data security and data compliance risks posed by legacy data storage and management architectures.

The embodiments of the present application described herein provide technical solutions that address, at least the needs described above.

BRIEF DESCRIPTION OF THE FIGURES

FIG. 2 illustrates an example method 200 in accordance with one or more embodiments of the present application;

BRIEF SUMMARY OF THE INVENTION(S)

Figure 1:
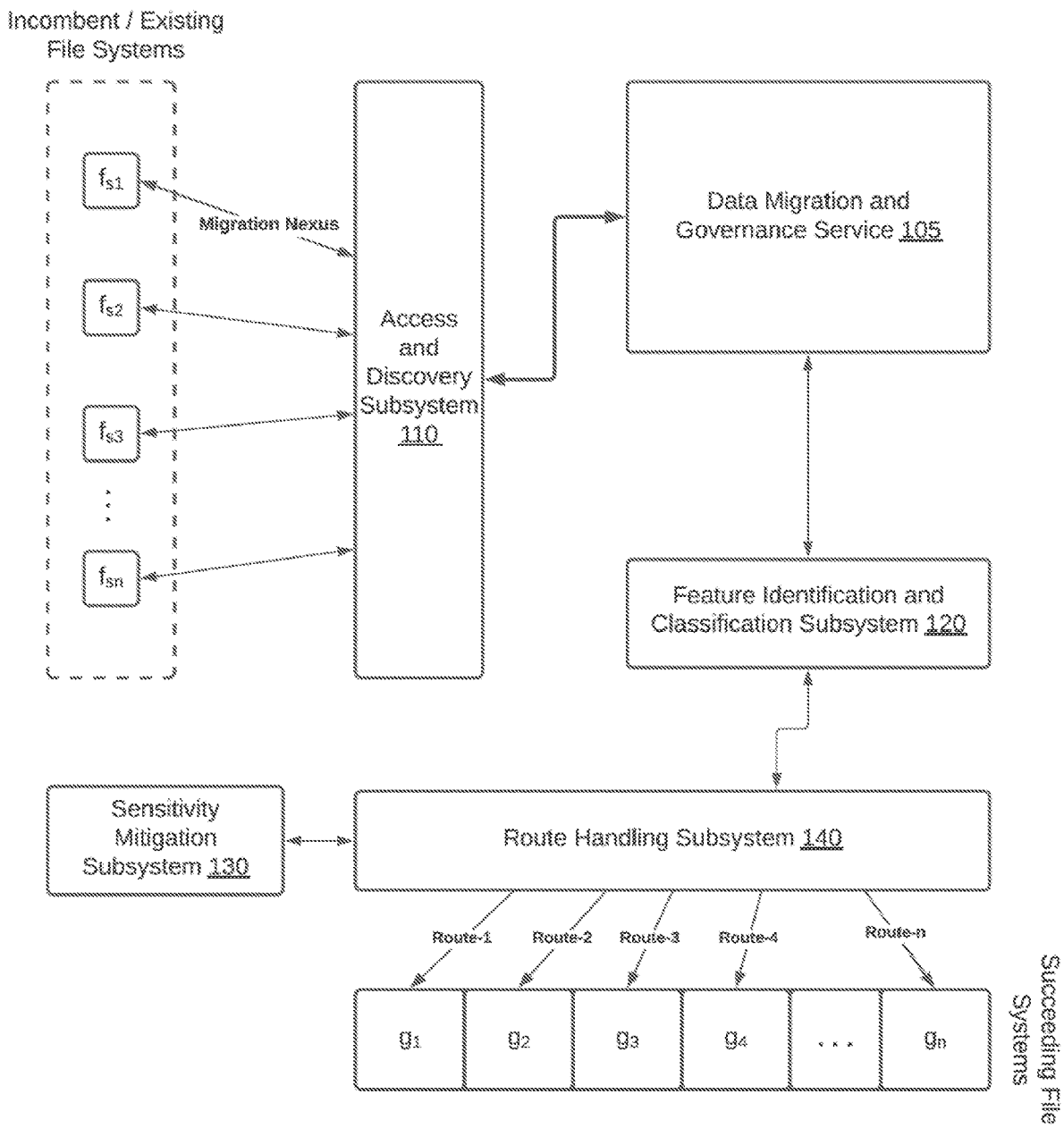
FIG. 1 illustrates a schematic representation of a system 100 in accordance with one or more embodiments of the present application.
Figure 3:
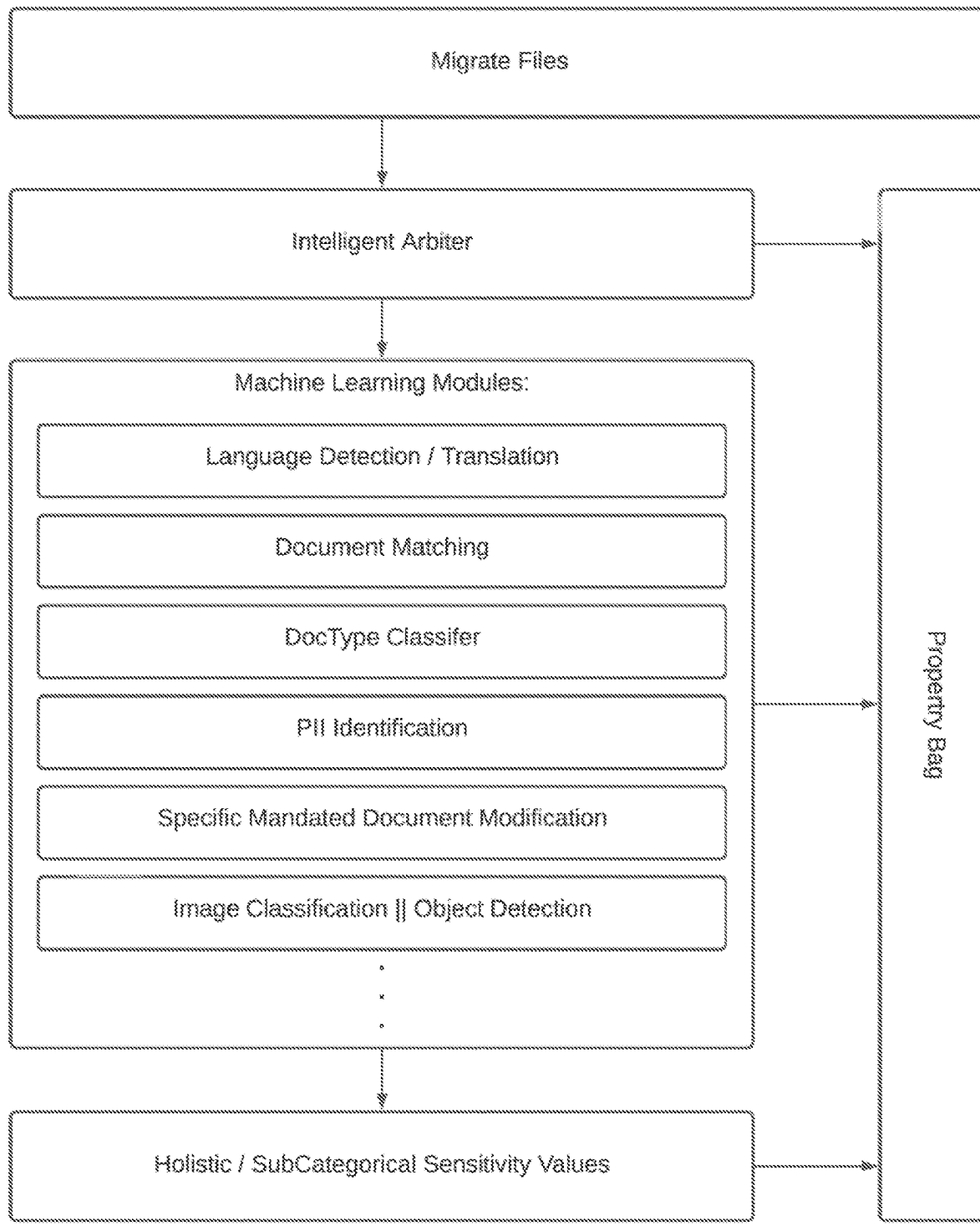
FIG. 3 illustrates a schematic representation of a first implementation of one or more sub-components of the system 100 in accordance with one or more embodiments of the present application.
Figure 4:
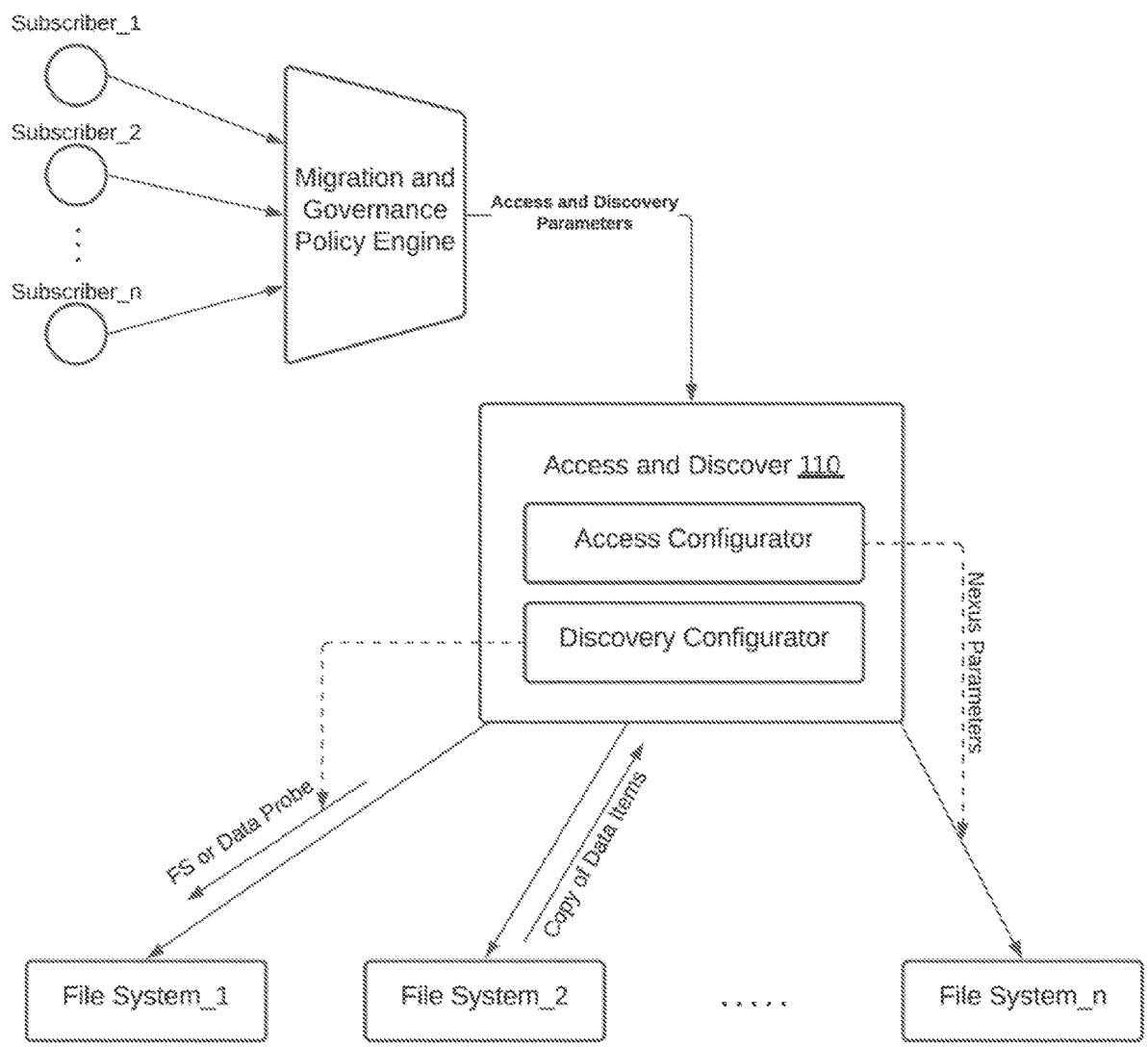
FIG. 4 illustrates a schematic representation of a second implementation of one or more sub-components of the system 100 in accordance with one or more embodiments of the present application.

In one embodiment, a machine learning-based method of computing in-migration classifications for and migrating items of digital content, the method comprising: accessing a digital content corpus comprising a plurality of distinct items of digital content within a source data storage system; in response to accessing the digital content corpus, for each distinct item of digital content of the plurality of distinct items of digital content: (i) computing, via one or more digital content machine learning classification models, an in-migration content classification inference; (ii) identifying one or more automated digital content handling tasks of a plurality of distinct digital content handling tasks based on the in-migration content classification inference; (iii) executing the one or more automated content handling tasks identified for each of the plurality of distinct items of digital content, wherein executing the one or more automated content handling tasks includes: (a) designating a storage location within a target data storage system based on the in-migration content classification inference; and (b) migrating a respective item of digital content from the source data storage system to the designated storage location within the target data storage system.

In one embodiment, the in-migration content classification inference relates to a machine learning-derived probability or likelihood that a target item of digital content comprises one digital content category of a plurality of distinct categories of digital content.

In one embodiment, computing the in-migration content classification inference includes: (1) extracting content features from each of the plurality of distinct items of digital content; (2) extracting metadata features from each of the plurality of distinct items of digital content; and (3) providing one or more of the extracted content features and the extracted metadata features for each of the plurality of distinct items of digital content, as model input, to the one or more digital content machine learning classification models for computing the in-migration content classification inference.

In one embodiment, the method includes computing, via the one or more digital content machine learning classification models, an in-migration content sensitivity inference for each of the plurality of distinct items of digital content, wherein the identifying the one or more automated digital content handling tasks of the plurality of distinct automated digital content handling tasks for each of the plurality of distinct items of digital content is further based on the in-migration content sensitivity inference for each respective distinct item of digital content.

In one embodiment, the in-migration content sensitivity inference relates to a machine learning-derived probability or likelihood that a target item of digital content contains access-restricted content data as defined by data handling policy of a subscriber.

In one embodiment, the method includes converting the in-migration content sensitivity inference to a content sensitivity score that indicates a degree to which the target item of digital content contains sensitive data or sensitive information; and assessing the content sensitivity score including identifying whether the content sensitivity score for each of the plurality of distinct items of digital content satisfies one or more content sensitivity thresholds, wherein the identifying the one or more automated digital content handling tasks of the plurality of distinct automated digital content handling tasks for each of the plurality of distinct items of digital content is further based on the assessment of the content sensitivity score.

In one embodiment, the one or more digital content machine learning classification models include: (1) a first fast-content machine learning classification model that generates a fast-content classification inference based on metadata features extracted from a target item of digital content.

In one embodiment, the first fast-content machine learning classification model comprises a filename machine learning classifier that operates to produce the fast-content classification inference based on model input of metadata comprising a filename of the target item of digital content.

In one embodiment, the one or more digital content machine learning classification models include: (2) a second enhanced-content classification machine learning model that is instantiated for producing the in-migration content classification inference when a classification confidence of the fast-content classification inference does not satisfy a content classification inference threshold.

In one embodiment, the one or more digital content machine learning classification models define an extensible ensemble of distinct digital content machine learning classification models that operate in concert to produce one or more distinct classification inferences for a target item of digital content; and the extensible ensemble of distinct digital content item classification models includes: (1) a fast-content machine learning classification model that produces a fast-content classification inference based on an input of metadata features extracted from the target item of digital content; (2) a file-document machine learning classification model that produces a file-document classification inference based on an input of content features extracted from within the target item of digital content; and (3) a personally identifiable information (PII) machine learning classification model that generates a PII content classification inference based on an input of content features extracted from within the target item of digital content.

In one embodiment, the method includes for each distinct item of digital content of the plurality of distinct items of digital content: computing a distinct content classification label based on the in-migration content classification inference, wherein identifying one or more automated digital content handling tasks includes identifying the one or more automated digital content handling tasks associated with the distinct content classification label.

In one embodiment, the method includes performing, by one or more computers, a redundant-obsolete-trivial (ROT) data assessment of the digital content corpus within the source data storage system; identifying one or more items of digital content of the digital content corpus as ROT data; and bypassing the in-migration content classification inference for each of the one or more items of digital content identified as ROT data.

In one embodiment, the one or more digital content machine learning classification models include: an out-of-scope (OOS) machine learning classification model that generates an OOS content classification inference based on extracted content features of a target item of digital content indicating a probability or a likelihood that the target item of digital content is not within a recognized category or a recognized class of content item thereby preventing a positive content classification of the target item of digital content.

In one embodiment, the one or more digital content machine learning classification models include: a personally identifiable information (PII) machine learning classification model that generates a PII content classification inference based on extracted content features of a target item of digital content indicating a probability or a likelihood that the target item of digital content contains personally identifiable information.

In one embodiment, the one or more digital content machine learning classification models include: an image content machine learning classification model that generates an image content classification inference based on extracted content features of a target item of digital content, wherein the image classification inference relates to a probability or a likelihood that a target image associated with a target item of digital content belongs to a given category of image of a plurality of distinct categories of images.

In one embodiment, the method includes implementing an intelligent model arbiter that selectively instantiates a subset of machine learning classification models of the one or more digital content machine learning classification models based on an extracted feature corpus for each of the plurality of distinct items of digital content, wherein computing the in-migration content classification inference for each of the plurality of distinct items of digital content includes distinctly providing the feature corpus of each respective item of digital content of the plurality of distinct items of digital content as model input to the selectively instantiated subset of machine learning classification models.

In one embodiment, the method includes establishing a data handling nexus between the source data storage system and the target data storage system, wherein the data handling nexus creates one or more content communication channels that enable an automated routing of each of the plurality of distinct items of digital content of the digital content corpus from the source data storage system via a remote data handling service to the target data storage system.

In one embodiment, the method includes generating, via a graphical user interface, an artificially structured abstraction of the digital content corpus, wherein: (1) the digital content corpus includes a first sub-corpus of structured items of digital content and a second sub-corpus of unstructured items of digital content, (2) the artificially structured abstraction includes a first graphical element for accessing the first sub-corpus of structured items of digital content, and (3) the artificially structured abstraction includes a second graphical element for accessing the second sub-corpus of unstructured items of digital content.

In one embodiment, the one or more automated content handling tasks may include one or more content risk mitigation actions that, when executed, reduce a probability of unauthorized access to a target item of digital content.

In one embodiment, accessing the digital content corpus of items of digital content includes: identifying a data handling queue at a remote data handling service; and
    enqueuing a copy of each of the plurality of distinct items of digital content of the digital content corpus within the data handling queue, wherein the computing the in-migration content classification inference is performed while each of the plurality of distinct items of digital content is enqueued within the data handling queue.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. System for Intelligent Content Handling and Content Governance

As shown in FIG. 1, a system 100 for intelligent data handling and data governance includes a data handling and governance service 105, an access and discovery subsystem 110, a feature identification and classification subsystem 120, a sensitivity mitigation subsystem 130, and a content route handling subsystem 140. The system 100 may sometimes be referred to herein as an intelligent data handling and data governance system 100 or simply the data handling system 100.

1.05 Intelligent Content Access+Content Handling Subsystem

The data handling and governance service 105, sometimes referred to herein as the "data handling service 105" may be implemented by a distributed network of computers and may be in operable and control communication with each of the subsystems of the system 100. That is, the data handling service 105 may include a centralized controlling computer server(s) and associated computing systems that encourages and/or controls the intelligent data handling, data classification, and data governance operations of each of the subsystems 110-140.

In one or more embodiments, the data handling service 105 may function to implement a data handling and data governance application programming interface (API) that enables programmatic communication and control between the data handling system 100 and the one or more subservices therein and APIs of the one or more subscribers to the data handling service 105 of the data handling system 100.

1.1 Content Access+Discovery Subsystem

The access and discovery subsystem 110, which may be sometimes referred to herein as the "discovery subsystem" or "discovery subservice", preferably functions to enable one or more electronic connections between the data handling system 100 and one or more external systems of one or more subscribers to the data handling service 105. The discovery subsystem may include one or more access modules that may function to establish or create content communication channels, which are sometimes referred to as "migration nexus" or "data handling nexus", between the data handling system 100 and subscriber systems. In one or more embodiments, the data handling nexus may include any suitable medium and/or method of transmitting digital items between at least two devices including, but not limited to, a service bus, a digital communication channel or line, and/or the like.

The discovery subsystem 100 may additionally or alternatively include one or more discovery submodules that perform one or more content discovery actions and/or functions for identifying existing file and content systems within a computing architecture of a subscriber.

1.2 Content Feature Identification and Classification Subsystem

The feature identification and classification subsystem 120, which may sometimes be referred to herein as a "classification subsystem", preferably functions to compute one or more classification labels for each target file or target content being migrated and/or handled by the data handling system 100.

In one or more embodiments, the classification subsystem 100 includes a machine learning module or subsystem that may be intelligently configured to predict various classifications for each target file or target document including, but not limited to, identifying a document type, identifying sensitive information, identifying a document's language (e.g., via a language detection model), identifying objects or images, identifying document form values, and/or the like. In such embodiments, the classification subsystem 100 may include a plurality of distinct machine learning-based classification submodules, which may be outlined herein below in the method 200.

Additionally, or alternatively, in some embodiments, the classification subsystem 100 may include one or more content classification modules that include extensible classification heuristics derived from one or more of subscriber-defined content policy and/or data handling service-derived content policy.

Additionally, or alternatively, the classification subsystem 100 may implementing one or more ensembles of trained machine learning models. The one or more ensembles of machine learning models may employ any suitable machine learning including one or more of: supervised learning (e.g., using logistic regression, using back propagation neural networks, using random forests, decision trees, etc.), unsupervised learning (e.g., using an Apriori algorithm, using K-means clustering), semi-supervised learning, reinforcement learning (e.g., using a Q-learning algorithm, using temporal difference learning), adversarial learning, and any other suitable learning style. Each module of the plurality can implement any one or more of: a regression algorithm (e.g., ordinary least squares, logistic regression, stepwise regression, multivariate adaptive regression splines, locally estimated scatterplot smoothing, etc.), an instance-based method (e.g., k-nearest neighbor, learning vector quantization, self-organizing map, etc.), a regularization method (e.g., ridge regression, least absolute shrinkage and selection operator, elastic net, etc.), a decision tree learning method (e.g., classification and regression tree, iterative dichotomiser 3, C4.5, chi-squared automatic interaction detection, decision stump, random forest, multivariate adaptive regression splines, gradient boosting machines, etc.), a Bayesian method (e.g., naïve Bayes, averaged one-dependence estimators, Bayesian belief network, etc.), a kernel method (e.g., a support vector machine, a radial basis function, a linear discriminate analysis, etc.), a clustering method (e.g., k-means clustering, density-based spatial clustering of applications with noise (DBSCAN), expectation maximization, etc.), a bidirectional encoder representation form transformers (BERT) for masked language model tasks, next sentence prediction tasks, text classification, and the like, variations of BERT (i.e., ULMFiT, XLM UDify, MT-DNN, SpanBERT, RoBERTa, XLNet, ERNIE, KnowBERT, VideoBERT, ERNIE BERT-wwm, MobileBERT, TinyBERT, GPT, GPT-2, GPT-3, GPT-4 (and all subsequent iterations), ELMo, content2Vec, and the like), an associated rule learning algorithm (e.g., an Apriori algorithm, an Eclat algorithm, etc.), an artificial neural network model (e.g., a Perceptron method, a back-propagation method, a Hopfield network method, a self-organizing map method, a learning vector quantization method, etc.), a deep learning algorithm (e.g., a restricted Boltzmann machine, a deep belief network method, a convolution network method, a stacked autoencoder method, etc.), a dimensionality reduction method (e.g., principal component analysis, partial lest squares regression, Sammon mapping, multidimensional scaling, projection pursuit, etc.), an ensemble method (e.g., boosting, bootstrapped aggregation, AdaBoost, stacked generalization, gradient boosting machine method, random forest method, etc.), and any suitable form of machine learning algorithm. Each processing portion of the system 100 can additionally or alternatively leverage: a probabilistic module, heuristic module, deterministic module, or any other suitable module leveraging any other suitable computation method, machine learning method or combination thereof. However, any suitable machine learning approach can otherwise be incorporated in the system 100. Further, any suitable model (e.g., machine learning, non-machine learning, etc.) may be implemented in the various systems and/or methods described herein.

1.3 Content Sensitivity Mitigation Subsystem

The sensitivity mitigation subsystem 130 preferably functions to perform one or more automated actions that reduces a sensitivity of a target file or target content or otherwise, improves a security of a target file or target content for protecting sensitive or secure content/information. Sensitive information or data preferably relate to data that must be guarded from unauthorized access and unwarranted disclosure to maintain the information security of an individual or an organization. In one or more embodiments, sensitive information may be defined based on subscriber information security policy or file system policy. In some embodiments, sensitive information may be defined based on data handling service-defined file system policy.

The sensitivity mitigation subsystem 130 may include a plurality of distinct automated sensitivity mitigation workflows or the like to which a target file or target content may be intelligently routed based on classification data.

1.4 Automated Document Identification Module

The content route handling subsystem 140 preferably functions to intelligently route each target file or target content based on classification inferences or predictions of the classification subsystem 120. In some embodiments, a succeeding or new file system of a subscriber may include a predetermined configuration for ingesting and/or storing target digital items and content. In such embodiments, the content route handling subsystem 140 may be configured based on the storage parameters and/or configurations of the succeeding file system(s) and perform a routing of target files and target content to appropriate regions or partitions of the succeeding file system(s).

Additionally, or alternatively, the content route handling subsystem 140 may function to route distinct target files and/or target content to the sensitivity mitigation subsystem 130 based on the one or more features discovered and classifications of the classification subsystem 120.

2. Method for Automated Content Handling+Content Classification

As shown in FIG. 2, a method 200 for intelligent data handling and data classification may include implementing file system discovery S210, implementing a file and/or content handling S220, implementing content recognition and content extraction S230, implementing feature discovery and feature extraction S240, classifying target digital items or content S250, and implementing classification-based content routing S260. The method 200 may optionally include creating a file system abstraction layer S215 and evaluating content sensitivity S255.

2.1 Access+Intelligent Discovery

S210, which includes implementing file system discovery, may function to establish one or more data handling nexus for transitioning file data and/or the like from one or more incumbent file systems. A data handling nexus, as referred to herein, preferably relates to a data communication channel through which a copy of or an original of file data and/or the like may be exported from a recognized incumbent file system or source data storage system to one or more target succeeding file systems. In one or more embodiments, a data handling nexus may additionally or alternatively relate to and/or comprise a bidirectional communication channel that enables a communication of one or more digital entities into one or more incumbent file systems and therefore, access and/or discovery entities may be communicated from an external source or entity (e.g., a migration and governance service, etc.) into one or more computing devices associated with the one or more incumbent file systems and/or within one or more files within a file system. Additionally, a file system as referred to herein may relate to any system or device for one or more of digital item management, digital item governance, and digital item storage (e.g., Sharepoint, Box, Google Drive, Dropbox, electronic content management systems (ECMs), and/or the like).

Intelligent Access

As mentioned above, a data handling nexus may enable bidirectional communication, including transmissions of data files, between a source of target data items, such as an incumbent file system, and a receiver or destination of the target data items (e.g., system 100, a data handling service, etc.). Additionally, or alternatively, a data handling nexus may be established between any source (e.g., file or storage systems, applications, and/or the like) of digital items and one or more destinations where one or more types of sources of digital items may function to handle digital items that may be at-rest or in-transit (e.g., digital items being stored or collected in real-time or near real-time).

In a first implementation, S210 may function to implement a data handling nexus that includes a programmatic connection between the one or more incumbent file systems and an external entity (i.e., a remote data handling service) performing a migration or handling of data from the one or more incumbent file systems. In this first implementation, a migration or data handling API of the data handling service may function to connect with or interface with one or more APIs associated with each of the one or more incumbent file systems. In this way, the data handling service via the data handling API or the like may function to automate one or more of file and file system discovery and file data handling based on API requests/calls or the like.

In a second implementation, S210 may function to implement a data handling nexus by implementing one or more access agents with the one or more incumbent file systems. In this second implementation, S210 may function to create one or more (digital) access agents based on subscriber data handling policy or the like that may be digitally installed at each of one or more incumbent file systems. In one or more embodiments, the one or more access agents may function to enable a communication between the one or more incumbent file systems and one or more of a data handling API or a data handling controller (e.g., an agent manager) of the remote data handling service.

Intelligent Discovery

S210, which includes implementing file or content system discovery, may function to discover one or more incumbent file or content systems of a subscriber. In some embodiments, a discovery or identification of file systems includes identifying each of a plurality of data repositories and memory locations that store at least one piece or item of content data or an electronic file. The piece or item of content may be any type or kind of content including, for example, but should not be limited to, electronic documents, text message data, chat messaging data, applications data, digital media, video recordings/messages, audio recordings/messages, image data, and/or the like. Accordingly, any suitable data repository including, for example, electronic communication data (e.g., emails), chat messaging repositories, data compression repositories, and/or the like may be identified in a discovery phase and scanned for an intelligent migration or similar routing or data handling.

Additionally, or alternatively, in a first implementation, the discovery of incumbent file systems may be automated based on file system policy instructions of a subscriber. In such embodiments, S210 may function to configure an automated search and/or automated discovery of one or more enumerated file system types based on the file system policy instructions and/or file discovery parameters. That is, in this first implementation, S210 may function to program, design, and/or configure one or more content or file discovery agents based on file discovery parameters that may function to identify incumbent file systems and inventory or enumerate the one or more files or pieces of content that may be stored in the identified incumbent file system.

In a preferred embodiment, a data handling service (e.g., system 100) or the like implementing the method 200 may function to implement a subscriber file system policy engine or the like comprising a plurality of distinct file system policy instructions and/or file discovery parameters for each of a plurality of distinct file systems of subscribers to the data handling service. In such preferred embodiment, each file system policy instruction within the file system policy engine may identify and/or enumerate file system discovery and/or file system and content handling instructions and/or discovery parameters. For example, a given file system policy for a given subscriber may include file system and content entity types that are expected for discovery, content handling and/or routing instructions, one or more classification labels and rules governing a labeling for distinct content items, specific features of files and/or content that inform a type of label for a target piece of content or file, and/or the like.

Additionally, or alternatively, the one or more incumbent file systems may be any suitable file system type or file system service including, but not limited to, on-premises data services and/or repositories, third-party or vendor data services or repositories (e.g., cloud-based systems), digital or electronic content management services, and/or the like.

In one or more embodiments, S210 may function to configure a discovery agent comprising a file system crawler. In such embodiments, the file system crawler may function to perform one or more of identifying file systems, copying file system data (e.g., file data), indexing file systems and/or file system data, and/or communicating file system data (e.g., file data, indexing data, file system location data, any suitable file system meta data, and/or the like) to a data handling service.

Additionally, or alternatively, in some embodiments, S210 may function to configure or encode a data handling agent (e.g., a migration agent or the like) that includes a composition of an access agent and discovery agent. Additionally, or alternatively, the data handling agent may be remotely controlled by the data handling service for performing one or more of access functions and discovery functions, as described here.

In a second implementation, S210 may function to perform file system discovery based on service-derived search and discovery parameters. In one or more embodiments in which subscriber file policy may be nonexistent or lacking in sufficient discovery parameters, S210 may function to implement service-defined discovery parameters, which may include searching or crawling network traffic and the like for discovering hidden or missed file systems. For instance, S210 may function to configure a discovery agent or the like that functions to inspect in-transmission data packets that may be stored by a network component or by a third-party service or third-party application.

It shall be recognized that S210 may function to configure each of the access agent and the discovery agent to interface with structured file systems and unstructured file systems.
Redundant, Obsolete, and Trivial (ROT) Data As a process of or, in some embodiments, distinct from an intelligent file or content discovery, S210 may additionally, or alternatively, perform a preliminary scan of discovered files or content of each identified repository or file system for redundant, obsolete, and/or trivial data. In one or more embodiments, redundant data, as referred to herein, preferably relates to data that may be a copy of or a substantial copy (e.g., having content exceeding a similarity threshold defined as a minimum value of similar content) of a piece of content or file. Obsolete data (i.e., a file or digital content item), as referred to herein, preferably relates to a target file or target content item that includes data that may be no longer useful for its original purpose, as defined by subscriber data handling policy. Trivial data, as referred to herein, preferably relates to a target file or target content item that may include content with no value to limited or minimal value to a subscriber owning the trivial data.

Accordingly, in one or more embodiments, S210 may function to initially or contemporaneous various discovery scans, identify redundant, obsolete, and/or trivial data and surface or route the associated digital files and/or digital content items based on data handling policy of a subscriber. In some embodiments, the data handling policy for redundant, obsolete, and/or trivial data may include, but should not be limited to, instructions or procedures for deletion, data minimization (e.g., data compression), non-migration, routing to a dedicated storage, and/or the like. It shall be recognized that S210 may function to implement any suitable technique or a combination of techniques described herein to discover and/or identify redundant, obsolete, and/or trivial data. In a non-limiting example, S210 may function to implement a trained file or content machine learning classifier to generate a ROT inference identifying a likelihood or probability that a target file or piece of content includes redundant, obsolete, and/or trivial data.

In one or more embodiments, a ROT inference that may positively identify (e.g., satisfies a ROT data threshold, such as a minimum ROT inference value) a target file or piece of content as being one or more of redundant, obsolete, and trivial may cause a system or service (e.g., intelligent model arbiter) implementing the method 200 to bypass an artificial intelligence scan or assessment (e.g., bypass an execution of the extensible document classifier, S230-S250, or the like).

2.15 Artificially Structured Abstraction Layer

Optionally, or additionally, S215, which includes abstracting one or more file systems, may function to implement or create an abstraction layer based on an identified structured incumbent file systems and unstructured incumbent file systems. A structured (incumbent) file system as referred to herein preferably relates to a file system having data items stored with a pre-defined data model or with a predefined storage scheme (from a perspective of a subscriber to the data handling service). An unstructured (incumbent) file system as referred to herein preferably relates to a file system having data items or files stored without a defined data model or without a predetermined storage scheme. For example, unstructured content repositories, such as messaging platforms (e.g., Slack, Google Chat, or the like) at which files or content are stored without a subscriber-recognized storage schema in a storage repository of the application provider or service provider. Accordingly, unstructured file systems, in some embodiments, represent file systems in which a storage location, a storage scheme of a given piece of content may not be readily accessible or known.

Accordingly, in one or more embodiments, the file system abstraction layer may function to normalize a system-perception or user-perception of varying and unique file systems (i.e., distinct structured and unstructured file systems). In one example, the file system abstraction layer may function to represent each identified structured file system and each identified unstructured file system as a similar abstracted representation. In this way, a user implementing or interfacing with the data handling service for performing one or more of a data handling and data governance tasks may be able to intuitively control or perform actions against unstructured file systems in a similar fashion as structured file systems. At least one technical benefit of an abstraction of the unstructured file systems in a same or similar manner as structured file systems may include a reduced complexity in interfacing with unstructured file systems, which may not have or share a common access scheme with structured file systems.

2.2 Data Handling|Data Migration

S220, which includes implementing a file and/or content handling, may function to apply an intelligent file handling scheme to a plurality of distinct files of incumbent file systems based on attributes of identified incumbent file systems.

Data Handling Queue

S220, which includes implementing a data handling queue, may function to implement a data handling queue that sequences and/or prioritizes the handling (e.g., migrations or the like) of files and/or content data from an incumbent file system. In one or more embodiments, files and/or content data of an incumbent file system when sequenced or when enumerated in a prioritized manner, may be exported from the incumbent file system or the data handling service to one or more succeeding file systems in the order in which the files and/or content data are positioned in the data handling queue. In one embodiment, the data handling queue may be distinctly implemented at or by the data handling service and includes an enumeration of all or presently-identified files and/or content for handling from a source file system to a destination file system.

In a first implementation, S220 may function to enqueue each of a plurality of distinct files of data and/or content data based on subscriber file system policy. In one or more embodiments, subscriber file system policy may include data handling parameters which may be used to encode the data handling queue. In such embodiments, an encoded or programmed data handling queue may function to receive file data or content data or receive a copy thereof and automatically position or re-position an associated file or an associated content within transmission queue of the data handling queue.

In a second implementation, S220 may function to enqueue each of a plurality of distinct files of data and/or content data based on attributes of the succeeding or destination file system(s). In such embodiments, the succeeding file system may be pre-configured for storing receiving and storing target digital items and content in a predetermined manner.

In a third implementation, S220 may function to enqueue each of a plurality of distinct files of data and/or content data based on any suitable attributes of the files and/or content and/or prioritization scheme that are subject to data handling including, but not limited to, a probability or likelihood of sensitivity, file or content size, a source location of a file or content, urgency in compliance or the like, utilization of the file or content, and/or the like.

2.3 Content Recognition|Content Extraction

S230, which includes implementing content recognition and content extraction, may function to process each target digital item (e.g., a migrating file) for identifying and extracting the one or more data items therein for one or more downstream applications. It shall be recognized that S230 may function to evaluate any aspect of a target digital item including, but not limited to, content (e.g., text content, image/object content, audio content, etc.) within the target digital item as well as metadata (e.g., a size, a name, a date of creation, dates of modification, etc.) describing the target digital item, per se. In a preferred embodiment, S230 may function to implement content recognition and content extraction while each target digital item may be in-transit from a source location (e.g., incumbent file system) to a destination location (e.g., succeeding file system). In such preferred embodiment, S230 may function to process content of the target digital items at the data handling service.

In one or more embodiments, S230 may function to implement multiple, distinct content recognition and/or content extraction techniques, which may include, but should not be limited to, character recognition, image or object recognition, audio recognition, video recognition, and/or the like.

In one embodiment, S230 may function to perform character and text recognition using any suitable character recognition application or scanner, such as optical character recognition (OCR). In such embodiments, S230 may function to identify typed or written text or characters of a target file and extract the identified text or characters of the target file to a content collection or container.

In another embodiment, S230 may function to implement image/object recognition and/or extraction on a target file. Similar to the character/text recognition, each identified object and/or image discovered within the target file may be extracted to a content container (e.g., a property bag or the like) assigned to the target file.

In yet another embodiment, S230 may function to implement audio and/or video recognition and/or extraction on a target file. In circumstances in which the target file comprises a video (e.g., a Zoom video recording, meeting recording, etc.), S230 may function to implement video recognition for identifying a probable subject of the video and/or the like. Likewise, S230 may function to perform audio recognition of audio or audio/visual target files for identifying a probable subject of the target file.

In some embodiments, S230 may function to assign the content container with a file identifier of the target file for tracking and/or electronic association of the content container.

In some embodiments, in advance of a processing of a target file or content, S230 may additionally or alternatively perform file enhancements to enable improved content recognition and extraction of a target file.

2.4 Feature Discovery|Feature Extraction

S240, which includes implementing feature discovery and feature extraction, may function to evaluate each target digital item or item of content for one or more extractable features. In one or more embodiments, S240 may function to implement a feature extractor that is configured or specifically designed for identifying file or content features that may support an inference or an estimation of a likely file type or content type for each target digital item or content. In one or more embodiments, the extracted features by the feature extractor may be converted to model or system input and/or the like for classifying each target digital item.

S240 may function to aggregate features of a target file or content to a feature container or feature corpus that includes a collection of the features of the target file and the like. In a preferred embodiment, S240 may function to compute a corpus of feature vectors based on a feature container for each target file. In such embodiments, S240 may function to implement or use one or more content embeddings models or services that may function to convert the file features or content features to distinct feature vector values. In some embodiments, S240 may function to implement multiple, distinct embeddings models and/or services for each distinct feature type (e.g., object features, text features, etc.). Accordingly, for each target digital item, S240 may function to compute a corpus of feature vectors comprising a plurality of distinct feature vectors based on the feature container for a target file.

2.5 Content Classification|Sensitivity Evaluation

S250, which include classifying target digital items or content, may function to classify each distinct file or piece of content to one or more of a plurality of distinct classes or categories of file type or content type.

i. Machine Learning-Based File/Content Classification

In a first implementation, S250 may function to implement a machine learning-based content classification module. In this first implementation, the machine learning-based content classification module comprises one or more machine learning classifiers designed and trained to predict a file or a content classification or type for each target file or a target piece of content. In this first implementation, the file or content classification inference may be used to inform a data handling route and/or data handling policy that should be automatically executed for handling a target file or content item.

Additionally, or alternatively, in some embodiments, the machine learning-based file or content classification inference may be considered or may be referred herein as an in-migration content classification inference or the like. In such embodiments, the in-migration content classification inference includes a content classification inference performed during a migration of a target piece of content from an incumbent (or source) file system to a succeeding (or target) file system. That is, once a migration nexus may be established or an intelligent discovery and/or scan (as described in S210) may be performed by a service or system implementing the method 200, a content classification inference may be generated for each file or content item before the file or content item may be migrated or transmitted to the succeeding file system.

In a preferred embodiment, the machine learning-based content classification module may be configured or trained to predict a plurality of distinct, file or content types. That is, the machine learning-based content classification module may function to produce at least one inference for a type of class labeling for each target file or target content, preferably, based on an input of a corpus of feature vectors of the target file or target content.

In one embodiment, the machine learning-based content classification module includes an ensemble of distinct machine learning models that may function to operate in concert to produce a single file or content classification for a target file or target content. In another embodiment, each distinct machine learning model of the ensemble may function to produce a distinct inference of a distinct file or content classification.

Extensible Document or Content Classification

Additionally, or alternatively, when a target file or target content includes a document or the like, S250 may function to implement an extensible document classification module or sub-module of the machine learning-based content classification module. In such embodiments, the document classification sub-module may be triggered based on one or more identified features of the target file or target content, preferably identified from a feature container or feature corpus associated with the target file or target content.

In one or more embodiments, the machine learning-based file classification module may include a trained a document machine learning classifier. In a preferred embodiment, the document machine learning classifier comprises an ensemble of single, distinct document machine learning classifiers that may each be distinctly trained to make an inference of one distinct document type. That is, each single, distinct machine learning classifier within the ensemble may be trained to predict only one of a plurality of distinct document types or classes. In this way, a produced inference of a first distinct machine learning classifier of the ensemble may include an estimation or a likelihood (e.g., 37% probability of an "invoice document", etc.) that a target document may be a first document type and a second distinct machine learning classifier of the ensemble may include an estimate or a likelihood (e.g., 86% probability of a "bank statement", etc.) that the same target document may be a second document type. In such embodiment, an output of the ensemble may include the machine learning having a highest confidence or probability. In some embodiments, the output of the ensemble may be based on the one or more distinct inferences satisfying a confidence threshold (i.e., a minimum probability or confidence level), such that only the machine learning inferences satisfying the confidence threshold may be applied as document classification labels for a target document.

In one or more embodiments, the plurality of distinct machine learning classifiers defining the ensemble may be arranged in a hierarchical manner, such that one or more inferences of one or more distinct machine learning classifiers may encompass one or more additional, distinct inferences of other distinct machine learning classifiers of the ensemble. In one example, inferences of "bank statement" document and "invoice" document by a first and a second machine learning classifier, respectively, may be encompassed by a general classification of "financial statement" document of a third machine learning classifier, which may be organized in a higher hierarchical position relative to the first and second machine learning classifiers. Accordingly, in some embodiments, S240 implementing the ensemble of machine learning classifiers of the document machine learning classifier may function to produce multiple distinct classification inferences and therefore, classification labels for a target document.

Filename Classifier|Metadata Classifier

In one or more embodiments, the extensible document classification module or sub-module of the machine learning-based content classification module may include a content filename-metadata machine learning classifier. The content filename-metadata machine learning classifier preferably functions to produce a content classification inference for a target file or a piece of content item based on metadata associated with the file or piece of content, as described in U.S. Patent Application No. 63/328,711 titled "SYSTEMS AND METHODS FOR MACHINE LEARNING-BASED CLASSIFICATION OF DIGITAL FILES USING FILE METADATA", which is incorporated herein in its entirety by this inference.

In one or more embodiments, the content filename-metadata classifier may define a distinct machine learning model of an ensemble of distinct content machine learning-based classifiers. In such embodiments, the content filename-metadata classifier may be considered a lightweight classifier relative to various other content classifiers based on having a less computationally complex algorithmic structure that may enable a faster computation of a content classification inference. In some embodiments, S240 may function to implement the content filename-metadata classifier as a fast content-classifier that may operate to produce a (fast) content classification inference for a target file or piece of content based on a part or subset of a feature and/or metadata corpus of a target file or piece of content. In a first non-limiting example, S240 may function to provide metadata features comprising filename data (i.e., an identifying name given to a computer file), as input, to the content filename-metadata classifier for producing a content type classification inference. In a second non-limiting example, S240 may function to provide metadata features comprising a number of pages of a target piece of content or file, as input, to the content filename-metadata classifier for producing a content type classification inference.

Additionally, or alternatively, S240 may function to compute a confidence value (e.g., a degree of certainty in the inference or prediction) along with and/or derived based on the fast classification inference. In some embodiments, the fast content classification inference and/or confidence value for a given target file or piece of content may inform an operation of an intelligent model arbiter (as described in S250) that may either route or migrate the target file or piece of content item based on the fast content classification inference or select one or more additional content classification models to assist in producing a further (or enhanced) content classification inference using a greater portion of the feature and/or metadata corpus associated with the target file or target piece of content. In a non-limiting example, a fast classification inference having a confidence value that may satisfy inference confidence threshold (e.g., a minimum confidence value) may cause an intelligent arbiter or the like to route the feature corpus of a target file or piece of content to an enhanced or robust machine learning-based classification model or ensemble having greater predictive capabilities (e.g., higher accuracy), but, in some embodiments, with a tradeoff of efficiency (e.g., speed of prediction).

Out-of-Scope Classifier (Sub-Module)

Additionally, or alternatively, S240 implementing the document machine learning classifier may function to classify target documents that may be out of scope or that do may not belong to the recognized document types for which the document classifier may be trained to produce a successful classification inference.

In one implementation, the document machine learning classification module may include an out-of-scope document classifier that is trained and/or configured to specifically produce an out-of-scope inference indicating that a target document may likely be a document that is not one of the recognized document class or type for which a document machine learning classifier that may be a member of the ensemble may be able to produce a successful (e.g., an inference satisfying the confidence threshold or the like) document classification.

In another implementation, the document machine learning classification module may include an out-of-scope module that may output an estimation of that a target document may be an out-of-scope document if none of the document machine learning classifiers which may be members of an ensemble defining the document classifier is able to produce a successful inference of a document classification type for the target document. That is, if all members of the ensemble fail to produce an inference that satisfies a confidence threshold, S240 may function to compute a classification label for the target document indicating that the target document may be a document that is not recognized, foreign, and/or out-of-scope.

PII Classifier (Sub-Module)

Additionally, or alternatively, the document machine learning classification module may include a sub-module comprising a personally identifiable information (PII) classifier or which may be sometimes referred to herein as a "PII discovery module". In some embodiments, PII preferably relates to any representation of information that may permit an identity of an individual to whom the information applies to be reasonably inferred by either direct means or indirect means. One or more examples of PII may include, but should not be limited to, names, addresses, bank account numbers, passport numbers, social security numbers, age or other demographic information, and/or the like. In one or more embodiments, the PII classifier may function to implement one or more of a heuristics-informed search for PII and a machine learning-based discovery of PII within target files or target content.

In a first implementation, the PII discovery module may function to implement a plurality of regex-based search and discovery patterns and/or a plurality of PII search heuristics that may function to intelligently inform a search function to patterns or strings of characters and text that may contain PII or other sensitive data within a file, piece of content, and/or document. For example, the PII discovery module may function to implement a regular expression search which may be configured based on one or more pattern-based heuristics or pattern-based rules for identifying strings of text and the like that may include PII or other sensitive data.

In a second implementation, the PII classifier comprises one or more machine learning models that may function to identify and/or extract PII entities from target files or target content. In this second implementation, the one or more machine learning models may be specifically trained and/or configured to produces inferences for identifying PII or other sensitive data within target files or target content.

In some embodiments, the heuristics-based classifier and machine learning-based classifier of PII and other sensitive information may be used in combination.

Extensible Document Archetype-Based Classification-|Document Matcher

Additionally, or alternatively, the document machine learning classification module may include a sub-module comprising a document identification classifier that is preferably pre-configured to identify a target document as one of a plurality of distinct predetermined document.

In a variant implementation, the document identification classifier may be implemented using one or more trained machine learning models (e.g., one or more trained convolutional neural network). In such implementation, the one or more trained machine learning models may be trained using a corpus of training samples that include a plurality of distinct document archetypes. Accordingly, for each input of a target document that may be evaluated by the document classifier, the machine learning-based document classifier may function to produce an inference or prediction that includes at least one of the plurality of distinct document archetypes for the target document.

In one or more embodiments, the document identification classifier may function to implement a document matching algorithm or scheme that includes performing a similarity evaluation that compares each target document or target content to a plurality of distinct document archetypes. Accordingly, based on the comparison, the document identification classification may function to output a probable document form identifier or document form type for each target rile or target content. In some embodiments, the similarity evaluation includes forming a plurality of distinct document pairwise between a target document and each distinct document archetype of the plurality of distinct document archetypes, computing a similarity value for each distinct document pairwise, and ranking the plurality of distinct document pairwise according to its associated with similarity value. In such embodiments, S240 may function to select the distinct document archetype within the distinct document pairwise having the highest similarity value. Alternatively, S240 may function to apply a similarity threshold or the like that relates to a minimum similarity value (e.g., 70 similarity score) and may function to select any distinct document archetype within the distinct document pairwise that satisfies the similarity threshold.

The document identification module may be extensible to include any number of or type of forms or documents.

Language Classifier+Image/Object Classifier

The document classification module may additionally or alternatively include one or more of a language machine learning classifier and an image machine learning classifier. In one or more embodiments, the language machine learning classifier includes one or more trained machine learning models that may function to predict or classify a plurality of distinct languages. For example, the language machine learning classifier may function to predict whether a target document may be in the English, French, Japanese language or the like. In some embodiments, an inference or language classification of a document by the language classifier of a target file or target document of a language that may be different than expected or preferred language for a subscriber may function to automatically trigger or cause a routing of the target file to a language translation module to convert the language of the target file or target document to the preferred language.

In one or more embodiments, the image classifier includes one or more trained machine learning models that may function to predict or classify objects or images extracted or identified in a target file or target document. In some embodiments, the image classifier may be trained to predict a classification of potentially sensitive objects or entities within a document, such as a driver license or the like.

ii. Intelligent Model Arbiter

Additionally, or alternatively, S250 may function to implement an intelligent model arbiter for identifying or selecting one or more modules and/or machine learning models to apply for classifying each of a plurality of target files or target content.

In one or more embodiments, the intelligent model arbiter may function to intelligently select one or more the identified file or content classification models based on a feature container, feature corpus, and/or metadata corpus for a target file or target content. In such embodiments, the feature container may inform the intelligent model arbiter regarding the probable file or content classifications that may be required for a given file or content. For example, if a feature container for a target file includes data indicating an object or image (e.g., jpeg object) may be stored in the feature container, the intelligent model arbiter may function to select or activate an image machine learning model that classifies images. In another example, one or more of the machine learning modules may be defined with multiple distinct types of machine learning classifiers having efficiency or other characteristics. For instance, a document type classifier may include a small-and-fast classifier and a large-and-slow classifier, which the intelligent model arbiter may intelligent select one of which to activate for classifying a target file or target content based on one or more probable features of the target file or the target content.

In one implementation, S250 implementing the intelligent model arbiter may function to perform a selection and/or instantiation of one or more machine learning classifiers using machine learning model decisioning matrix or similar data structure. In such embodiments, the intelligent model arbiter may function to perform a search or lookup of the machine learning model decisioning matrix based on features of the feature and/or metadata corpus of a target file or piece of content. Accordingly, in some embodiments, S250 may function to define a matrix search or lookup using one or more features of a feature and/or metadata corpus of the target file or piece of content. In such embodiments, the one or more models identified in the machine learning model decisioning matrix having matches or a best matches to the feature types used in the search or lookup may be automatically selected or instantiated and implemented for computing one or more content classification inferences for the target file or piece of content.

2.55 Machine Learning-Informed Sensitivity Scoring

Optionally, S255, which includes evaluating content sensitivity, may function to compute based on a feature vector corpus for a given target file or target content sensitivity value that may be sometimes referred to herein as a "sensitivity score" or "ACT score". In a preferred embodiment, a sensitivity score relates to a machine learning-computed probability or likelihood that a target piece of content includes sensitive data or information. In some embodiments, a sensitivity score may take a value between zero (0) and one-hundred (100) where a value at or relatively closer to 0 indicates a lower likelihood of sensitivity and a computed value at or relatively closer to 100 may indicate a higher likelihood that a target piece of content includes sensitive data.

In one or more embodiments, S255 may function to compute a sensitivity score that may be a composition of a plurality of sub-sensitivity scores produced by each of a plurality of distinct sensitivity scoring machine learning models. In such embodiments, the composed sensitivity score may be an average of the individually computed sensitivity scores or inferences. In another embodiments, S255 may function to weight the computed sensitivity values may be weighted differently within the composition, such that each distinct sensitivity score contributes differently to the composed or final sensitivity score output.

In some embodiments, S250 may function to use the sensitivity score as an input signal to drive or inform file or content routing.

It shall be noted that each of the above-described classification modules and in some embodiments, including the intelligent model arbiter may be configured with varying thresholds based on subscriber-derived file policy or preferences.

2.6 Classification-Based Handling|Routing

S260, which includes implementing classification-based content routing, may function to select from one of a plurality of distinct content handling or content routings based on the computed content classification and/or content sensitivity scoring. In some embodiments, the content or file routing may include one or more routes to automated sensitivity mitigation workflows/tasks or content risk mitigation actions or tasks that may reduce a sensitivity risk or access risk of a target file or target content. In one or more embodiments, the content or file routing may include one or more routes for automated content data handling to pre-defined storage locations within a succeeding file system or the like.

Additionally, or alternatively, S260 may function to implement classification-based handling including setting and/or defining governance parameters for access controls based on a computed content classification and/or content sensitivity scoring. In one or more embodiments, each distinct classification inference or file/content classification type or category may be associated with a distinct governance instructions, such that a production of a given classification inference may enable a selection and/or automated execution of an associated or corresponding distinct governance instruction (e.g., cleaning or removing sensitivity data, protecting data with enhanced access controls, deleting the target content or file, set firewall protection, set file or content tracking, and/or the like).

3. Computer-Implemented Method and Computer Program Product

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

As a person skilled in the art will recognize from the previous detailed description and from the figures and claims, modifications and changes can be made to the preferred embodiments of the invention without departing from the scope of this invention defined in the following claims.

We claim:

1. A machine learning-based method for migrating digital items, the method comprising:
   accessing a corpus of digital items comprising a plurality of distinct digital items stored within a source data storage system, wherein accessing the corpus of digital items includes:
      identifying a data handling queue at a remote data handling service; and
      enqueuing a copy of each of the plurality of distinct digital items of the corpus of digital items within the data handling queue,
   wherein the computing the classification inference is performed while each of the plurality of distinct digital items is enqueued within the data handling queue;
   for each distinct digital item of the plurality of distinct items:
      (i) computing, via one or more machine learning classification models, an classification inference;
      (ii) identifying one or more automated handling tasks of a plurality of distinct handling tasks based on the classification inference;
      (iii) executing the one or more automated handling tasks identified for each of the plurality of distinct items of digital item, wherein executing the one or more automated handling tasks includes:
         (a) designating a storage location within a target data storage system based on the classification inference; and
         (b) migrating a respective item of digital item from the source data storage system to the designated storage location within the target data storage system.

2. The method according to claim 1, wherein
the classification inference relates to a machine learning-derived probability or likelihood that a target digital item comprises one category of a plurality of distinct categories of digital item.

3. The method according to claim 1, wherein
computing the classification inference includes:
   (1) extracting features from each of the plurality of distinct digital items;
   (2) extracting metadata features from each of the plurality of distinct digital items; and
   (3) providing one or more of the extracted features and the extracted metadata features for each of the plurality of distinct digital items, as model input, to the one or more machine learning classification models for computing the classification inference.

4. The method according to claim 1, further comprising:
computing, via the one or more machine learning classification models, an in-migration content sensitivity inference for each of the plurality of distinct digital items,
wherein the identifying the one or more automated handling tasks of the plurality of distinct automated handling tasks for each of the plurality of distinct digital items is further based on the in-migration content sensitivity inference for each respective distinct digital item.

5. The method according to claim 4, wherein
the in-migration content sensitivity inference relates to a machine learning-derived probability or likelihood that a target item of digital item contains access-restricted content data as defined by data handling policy of a subscriber.

6. The method according to claim 4, further comprising:
converting the in-migration content sensitivity inference to a content sensitivity score that indicates a degree to which the target item of digital item contains sensitive data or sensitive information; and
assessing the content sensitivity score including identifying whether the content sensitivity score for each of the plurality of distinct digital items satisfies one or more content sensitivity thresholds,
wherein the identifying the one or more automated handling tasks of the plurality of distinct automated handling tasks for each of the plurality of distinct digital items is further based on the assessment of the content sensitivity score.

7. The method according to claim 1, wherein
the one or more machine learning classification models include:
   (1) a first machine learning classification model that generates a classification inference based on a subset of metadata features extracted from a target digital item.

8. The method according to claim 7, wherein
the first machine learning classification model comprises a filename machine learning classifier that operates to produce the classification inference based on model input of metadata comprising a filename of the target digital item.

9. The method according to claim 7, wherein:
the one or more machine learning classification models include:
  (2) a second enhanced classification machine learning model that is instantiated for producing the classification inference when a classification confidence of the classification inference does not satisfy a classification inference threshold.

10. The method according to claim 1, wherein:
the one or more machine learning classification models define an extensible ensemble of distinct machine learning classification models that operate in concert to produce one or more distinct classification inferences for a target digital item; and
the extensible ensemble of distinct classification models includes:
  (1) a content machine learning classification model that produces a content classification inference based on an input of metadata features extracted from the target digital item;
  (2) a file-document machine learning classification model that produces a file-document classification inference based on an input of content features extracted from within the target digital item; and
  (3) a personally identifiable information (PII) machine learning classification model that generates a PII content classification inference based on an input of content features extracted from within the target digital item.

11. The method according to claim 1, further comprising:
for each distinct digital item of the plurality of distinct digital items:
  computing a distinct classification label based on the classification inference, wherein identifying one or more automated handling tasks includes identifying the one or more automated handling tasks associated with the distinct classification label.

12. The method according to claim 1, wherein: the one or more machine learning classification models include:
  a personally identifiable information (PII) machine learning classification model that generates a PII classification inference based on extracted features of a target digital item indicating a probability or a likelihood that the target digital item contains personally identifiable information.

13. The method according to claim 1, wherein:
the one or more machine learning classification models include:
  an image machine learning classification model that generates an image classification inference based on extracted features of a target digital item, wherein the image classification inference relates to a probability or a likelihood that a target image associated with a target digital item belongs to a given category of image of a plurality of distinct categories of images.

14. The method according to claim 1, further comprising:
selectively instantiating a subset of machine learning classification models of the one or more machine learning classification models based on a feature corpus for each of the plurality of distinct digital items, the feature corpus for each of the plurality of distinct digital items comprising a distinct set of features extracted from a target digital item of the plurality of distinct digital items,
wherein computing the classification inference for each of the plurality of distinct digital items includes distinctly providing the feature corpus of each respective digital item of the plurality of distinct digital items as model input to the selectively instantiated subset of machine learning classification models.

15. The method according to claim 1, further comprises:
establishing a data handling nexus between the source data storage system and the target data storage system, wherein the data handling nexus creates one or more communication channels that enable an automated routing of each of the plurality of distinct digital items of the corpus of digital items from the source data storage system via a remote data handling service to the target data storage system.

16. The method according to claim 1, wherein
the one or more automated handling tasks include one or more risk mitigation actions that, when executed, reduce a probability of unauthorized access to a target digital item.

17. A method comprising:
accessing a corpus of digital items comprising a plurality of distinct digital items stored within a source data storage system;
performing, by one or more computers, a redundant-obsolete-trivial (ROT) data assessment of the corpus of digital items within the source data storage system;
identifying one or more digital items of the corpus of digital items as likely being a redundant data file, an obsolete data file, or a trivial data file (ROT data file), wherein trivial data file comprises a target item with no value to limited value or minimal value to a subscriber owning the trivial data file; and
bypassing the classification inference for each of the one or more digital items identified as the ROT data file;
for each distinct digital item of the plurality of distinct items:
  (i) computing, via one or more machine learning classification models, a classification inference;
  (ii) identifying one or more automated handling tasks of a plurality of distinct handling tasks based on the classification inference;
  (iii) executing the one or more automated handling tasks identified for each of the plurality of distinct items of digital item, wherein executing the one or more automated handling tasks includes:
    (a) designating a storage location within a target data storage system based on the classification inference; and
    (b) migrating a respective item of digital item from the source data storage system to the designated storage location within the target data storage system.

18. A method comprising:
accessing a corpus of digital items comprising a plurality of distinct digital items stored within a source data storage system;
for each distinct digital item of the plurality of distinct items:
  (i) computing, via one or more machine learning classification models, a classification inference, wherein:
    the one or more machine learning classification models include:
      an out-of-scope (OOS) machine learning classification model that generates an OOS classification inference based on extracted features of a target digital item indicating a probability or a likelihood that the target digital item is not within a recognized category or a recognized class of digital item thereby preventing a positive classification of the target digital item;
(ii) identifying one or more automated handling tasks of a plurality of distinct handling tasks based on the classification inference;
(iii) executing the one or more automated handling tasks identified for each of the plurality of distinct items of digital item, wherein executing the one or more automated handling tasks includes:
    (a) designating a storage location within a target data storage system based on the classification inference; and
    (b) migrating a respective item of digital item from the source data storage system to the designated storage location within the target data storage system.

\* \* \* \* \*